(12) United States Patent
Sheridan et al.

(10) Patent No.: US 8,466,017 B2
(45) Date of Patent: Jun. 18, 2013

(54) METHODS OF MAKING SEMICONDUCTOR DEVICES HAVING IMPLANTED SIDEWALLS AND DEVICES MADE THEREBY

(75) Inventors: David C. Sheridan, Starkville, MS (US); Andrew Ritenour, Colfax, NC (US)

(73) Assignee: Power Integrations, Inc., San Jose, CA (US)

( * ) Notice: Subject to any disclaimer, the term of this patent is extended or adjusted under 35 U.S.C. 154(b) by 204 days.

(21) Appl. No.: 12/962,823

(22) Filed: Dec. 8, 2010

(65) Prior Publication Data
US 2011/0133212 A1 Jun. 9, 2011

Related U.S. Application Data

(60) Provisional application No. 61/267,524, filed on Dec. 8, 2009.

(51) Int. Cl.
*H01L 21/337* (2006.01)

(52) U.S. Cl.
USPC ..... 438/192; 438/524; 438/931; 257/E21.447

(58) Field of Classification Search
USPC ........... 438/192, 524, 536; 257/263, E21.447
See application file for complete search history.

(56) References Cited

U.S. PATENT DOCUMENTS

| | | | |
|---|---|---|---|
| 5,903,020 A | 5/1999 | Siergiej et al. | |
| 6,767,783 B2 | 7/2004 | Casady et al. | |
| 6,821,834 B2 | 11/2004 | Ando | |
| 7,479,672 B2 | 1/2009 | Zhao | |
| 2006/0220072 A1* | 10/2006 | Harris et al. | 257/256 |
| 2006/0258086 A1 | 11/2006 | Manning et al. | |
| 2007/0187715 A1 | 8/2007 | Zhao | |
| 2009/0278177 A1 | 11/2009 | Sankin et al. | |

FOREIGN PATENT DOCUMENTS

EP 1267210 A2 12/2002

OTHER PUBLICATIONS

International Search Report dated Jul. 13, 2011.
Hook, Terence B. "Lateral Ion Implant Straggle and Mask Proximity Effect" IEEE Transactions on Electron Devices, vol. 50, No. 9, Sep. 2003, pp. 1946-1951.

* cited by examiner

*Primary Examiner* — Stephen W Smoot
(74) *Attorney, Agent, or Firm* — Morris, Manning & Martin, LLP; Christopher W. Raimund

(57) ABSTRACT

Semiconductor devices and methods of making the devices are described. The devices can be junction field-effect transistors (JFETs) or diodes such as junction barrier Schottky (JBS) diodes or PiN diodes. The devices are made using selective ion implantation using an implantation mask. The devices have implanted sidewalls formed by scattering of normal or near normal incident ions from the implantation mask. Vertical junction field-effect transistors with long channel length are also described. The devices can be made from a wide-bandgap semiconductor material such as silicon carbide (SiC) and can be used in high temperature and high power applications.

20 Claims, 6 Drawing Sheets

METHODS OF MAKING SEMICONDUCTOR DEVICES HAVING IMPLANTED SIDEWALLS AND DEVICES MADE THEREBY

This application claims the benefit of Provisional U.S. Patent Application Ser. No. 61/267,524, filed on Dec. 8, 2009, which is incorporated by reference herein in its entirety.

The section headings used herein are for organizational purposes only and should not be construed as limiting the subject matter described herein in any way.

BACKGROUND

1. Field

This application relates generally to semiconductor devices and to methods of making the devices.

2. Background of the Technology

A field-effect transistor (FET) is a type of transistor commonly used for weak-signal amplification (e.g., for amplifying wireless signals). The device can amplify analog or digital signals. It can also switch DC or function as an oscillator. In an FET, current flows along a semiconductor path called the channel. At one end of the channel, there is an electrode called the source. At the other end of the channel, there is an electrode called the drain. The physical diameter of the channel is fixed, but its effective electrical diameter can be varied by the application of a voltage to a control electrode called the gate. The conductivity of the FET depends, at any given instant in time, on the electrical diameter of the channel. A small change in gate voltage can cause a large variation in the current from the source to the drain thereby allowing for amplification of signals.

A PiN diode is a diode with a wide, lightly doped 'near' intrinsic semiconductor region between p-type semiconductor and n-type semiconductor regions. A junction barrier Schottky (JBS) diode is also referred to as a merged PiN Schottky diode since it contains both PiN and Schottky barrier (i.e., metal-semiconductor) junctions.

Vertical Junction Field Effect Transistor (VJFET) and Static Induction Transistor (SIT) devices in SiC have been described in U.S. Pat. Nos. 5,903,020 and 6,767,783; and in U.S. Patent Application Publication No. 2007/0187715 A1. In the case of an SIT, a short channel length is typically preferred in order to keep the frequency response high. Therefore a shallow p+ gate implant that does not create sidewall implantation on the trenched source fingers is preferred. In the power VJFET structure, however, it is preferred to have a long channel length in order for the device to be able to prevent the electric field under high reverse bias from reducing the channel barrier and causing increased drain-source leakage currents or total breakdown. In U.S. Patent Application Publication No. 2007/0187715 A1, angled implantation on the source finger sidewalls is disclosed as a method to create a long gate doping profile along the source channel length. This method has several disadvantages, however. Namely, the wafer has to be rotated during implantation in order to prevent implant shadowing in the trenched structure. Additionally, the angled implant causes uniform implantation along the vertical axis of the structure from the channel into the source region causing two adjoining heavily doped regions (source and gate). The close nature of these two regions result in poor voltage handling capability. Additionally, angled implantation along this axis can create significant channeling of the ions resulting in a non-symmetrical gate-source junction, particularly for SiC substrates which are typically cut off-axis (e.g., at an angle of 2-8 degrees).

Accordingly, there still exists a need for improved methods of making semiconductor devices.

SUMMARY

A method of making a semiconductor device is provided which comprises:

patterning an etch mask on an implant mask layer, wherein the implant mask layer is on a channel layer of a semiconductor material of a first conductivity type and wherein the channel layer is on an upper surface of a semiconductor substrate of the first conductivity type;

selectively etching through the implant mask layer and into the channel layer using the etch mask to form one or more raised source regions each having an upper surface and sidewalls adjacent etched regions of the channel layer each having a bottom surface;

implanting ions into the channel layer through the implant mask layer to form implanted regions of a second conductivity type in the semiconductor material on the bottom surfaces of the etched regions, wherein the ions are implanted at an angle of +/−10° from perpendicular to the upper surface of the semiconductor substrate and wherein at least some ions impinging on the implant mask layer are scattered by the implant mask to form implanted regions of the second conductivity type on the sidewalls of the raised regions, wherein the implanted regions on the bottom surface of the etched regions are connected to the implanted regions on adjacent sidewalls of the raised regions.

A semiconductor device made by a method as set forth above is also provided.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

FIGS. 1A-1E are schematics illustrating the manufacture of a VJFET device wherein:

FIG. 1A shows the starting device structure prior to implantation; FIG. 1B shows the deposition of a patterned etch mask that will be used to define the width and pitch of the source fingers; FIG. 1C shows the etching of the implant mask and channel layer; FIG. 1D shows the implantation of the p+ gate using ion implantation at an angle of 0° (i.e., perpendicular to the substrate surface); and FIG. 1E shows the resulting dopant profile in the device after implantation and removal of the implant mask.

DESCRIPTION OF THE VARIOUS EMBODIMENTS

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

Methods of making a Vertical Junction Field Effect Transistor (VJFET) with a long channel length by 0 degree implantation using intentional scattering of the ions from adjacent structures and devices made thereby are provided.

While the invention can be applicable to any vertical device that has an exposed sidewall requiring implantation (e.g., diode, transistor, vertical resistor), the specific embodiment of this invention enables a long channel VJFET that can be made in either the enhancement or depletion mode. The long channel of the device enables a high 'blocking gain' (a sharp transition from forward conduction to reverse blocking stage) while maintaining a long high-potential barrier to leakage currents from drain to source under high reverse bias.

Methods of using a trench and masking structure to create an ion implantation (i.e., doping) profile on a vertical trench sidewall in a semiconductor device are described. According to some embodiments, a long trenched channel Vertical Junction Field Effect Transistor in SiC is provided wherein angled sidewall implantation is not employed.

As described herein, the scattering of ions out by a masking layer creates a doping profile on the edge of a trenched semiconductor sidewall. The methods described herein can be used in the gate region of a VJFET. However, the methods described herein can be used to make any semiconductor structure which would benefit from an implanted sidewall, including, but not limited to, static induction transistors (SITs), bipolar junction transistors (BJTs), and junction-barrier Schottky diodes (JBS).

A method of making a VJFET is depicted in FIGS. 1A-1E and described below.

Figure 1A:
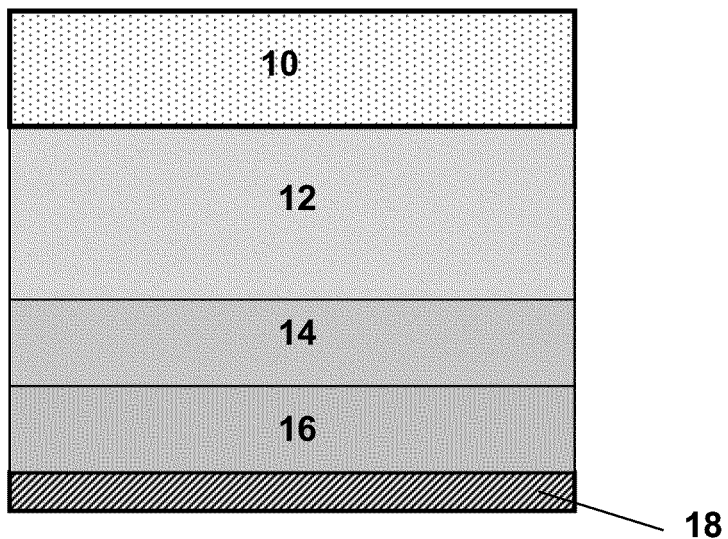

FIG. 1A shows the starting semiconductor structure prior to implantation process. As depicted in FIG. 1A, the device prior to implantation comprises an implant mask layer 10 on channel layer 12. As also shown in FIG. 1A, channel layer 12 is on drift layer 14 and drift layer 14 is on semiconductor substrate 16. Drain contact 18 is shown on substrate opposite drift layer 14. Although a drift layer is shown in FIG. 1A, the drift layer is optional (i.e., the channel and drift layers can be a single layer).

Drift layer 14 and channel layer 12 can be epitaxially grown. The doping type and concentration can be varied to provide desired characteristics for the device. For an re-channel VJFET, the substrate can be n-type with a nitrogen doping concentration of $1 \times 10^{18}/cm^3$ to $1 \times 10^{20}/cm^3$. The drift and channel nitrogen doping levels can be between $1 \times 10^{14}/cm^3$ and $1 \times 10^{18}/cm^3$. The thickness of the drift layer can be <100 µm and the thickness of the channel layer can be between 0.25 µm and 5 µm.

It is also possible to have a heavily doped >$5 \times 10^{18}$ n+ cap layer (not shown) on top of channel layer 12.

The implantation mask can be any of a variety of materials including a photoresist material, an oxide, a nitride, and deposited metals. The thickness of the implant masking material can be >0.5 µm. The thickness of the implant masking material can be varied depending upon the height of the semiconductor trench structure.

Figure 1B:
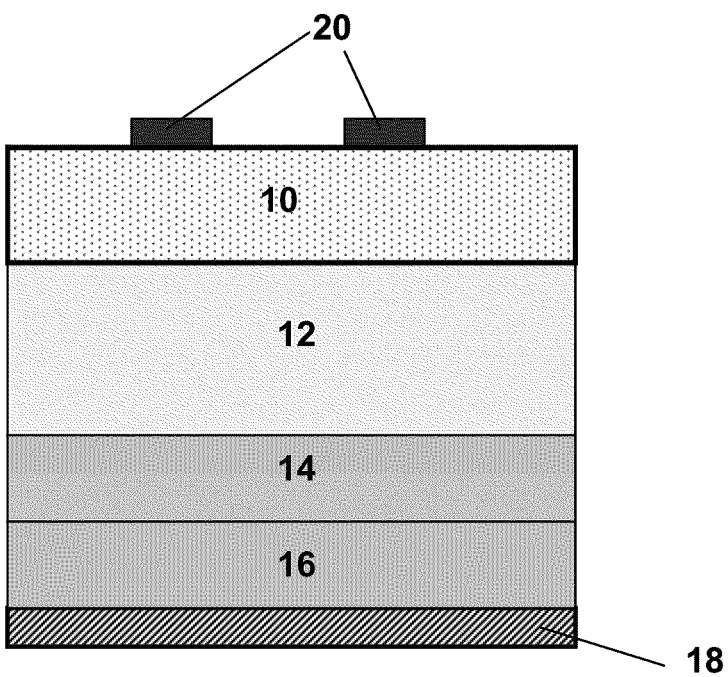

FIG. 1B shows the deposition of patterned etch mask 20 on implant mask layer 10. Patterned etch mask 20 is used to define the source finger width and pitch. The material used for patterned etch mask 20 can be a conventional semiconductor etch mask material such as an oxide, a metal, or a photoresist.

Figure 1C:
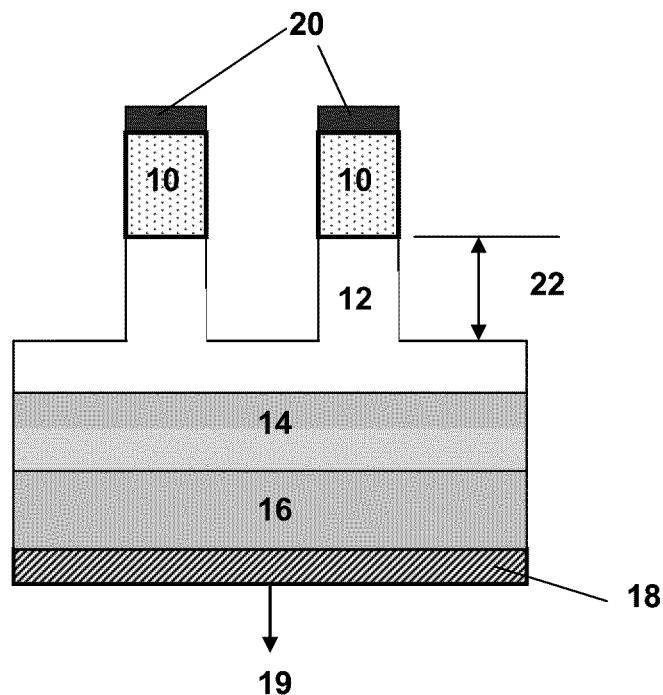

FIG. 1C is a schematic showing implant mask layer 10 and channel layer 12 being selectively etched using etch mask 20. Typically for SiC materials, the etch process will be performed by a dry Reactive Ion Etch (RIE) or Inductively Coupled Plasma (ICP) based plasma etch. The etching will continue through the implant/etch mask and continue to etch the SiC of channel layer 12 to a predetermined depth. The height of the etched channel 22 will be dependent on the design of the device. An exemplary etched channel height is 0.25 to 5 µm.

Figure 1D:
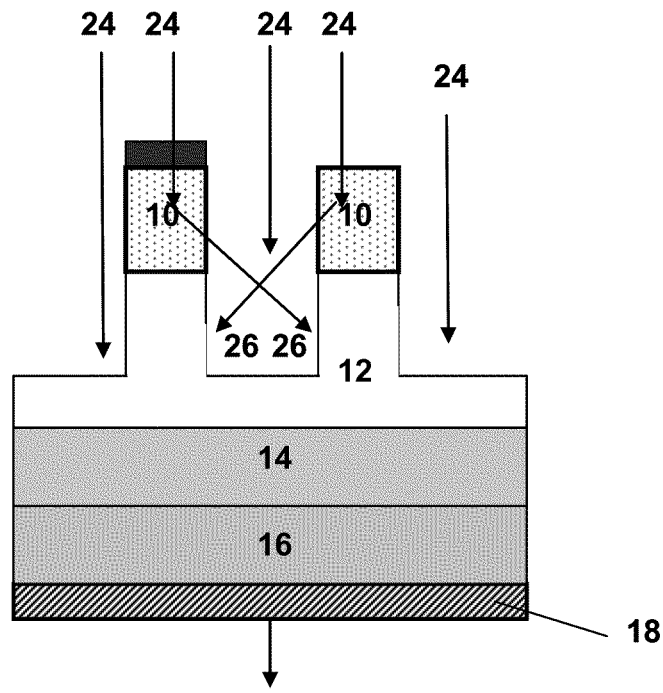

As shown in FIG. 1D, after the channel etch is completed, the implantation 24 of the p+ gate is performed using ion implantation at 0 degrees. Although 0° implantation is shown, alternate slight angles can be used. When an angled implantation is employed, the wafer can be rotated during the implantation process.

As shown in FIG. 1D, the ions arrive at the structure at an angle of 0 degrees (i.e., perpendicular to the wafer surface) and either enter the semiconductor surface between the source fingers thereby creating the bottom of the gate profile, or enter the implantation mask on top of the source fingers. Some of the ions that enter the implantation mask will encounter a scattering event and will have enough energy to exit the implantation mask at an angle that results in the ion being implanted in the source finger sidewall. The implantation dose and energy are variable depending on the amount and depth of the intended sidewall implantation. To have a deeper junction, the implantation energy should be high (e.g., 250 keV-2 MeV).

Figure 1E:
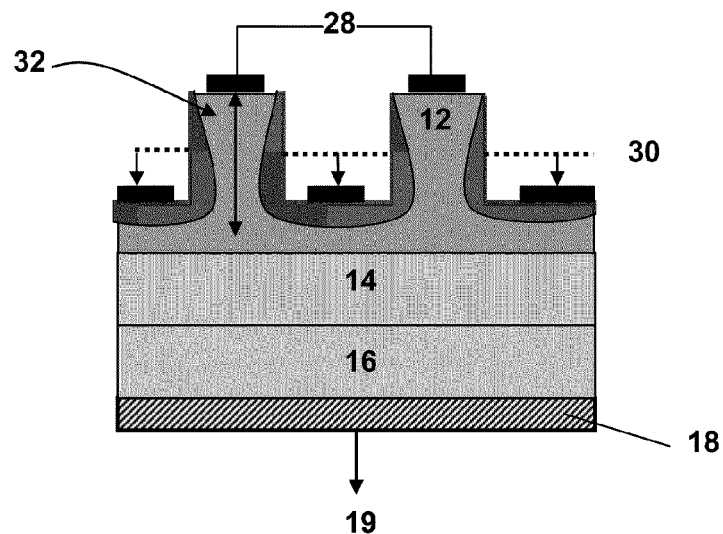

FIG. 1E is a schematic cross-sectional view of the device showing the resultant doping profile after the implantation and removal of implant mask 20. As can be seen from FIG. 1E, a p+ implanted regions are now formed along the sidewalls of the source fingers and at the bottom of the finger. As shown in FIG. 1E, the implanted sidewall regions are connected to the implanted region at the bottom of the trenches. This enables a long channel length 32 along the sidewall of the source fingers. This is compared to the short channel described in U.S. Pat. No. 5,903,020, wherein the implantation is only at the bottom of the trench which results in a short channel device optimum for a SIT device.

The subsequent processing can include implant activation and contact formation on the gate 30, drain 19, and source 28 of the device.

Figure 2:
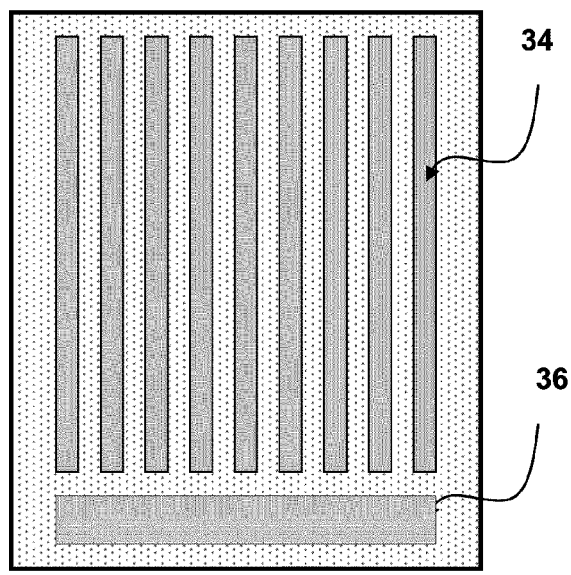
FIG. 2 is a schematic showing the top view of an exemplary layout of a source finger array having a periodic array structure which allows sufficient scattering implantation on the sidewalls of each source finger.

FIG. 2 is a schematic top down view of a device having a source finger array with a periodic array structure which allows sufficient scattering implantation on each source finger.

The structure is shown as a vertical array, but can be circular, hexagonal, etc, as long as there is an adjacent structure that causes scattering of the implantation into a sidewall.

Implant can be tilted 0-10 degrees and the substrate can be rotated during the implantation process to ensure that all sides of the structure are equally doped.

As set forth above, there does not need to be a separate channel and drift layer in the VJFET structure.

The dopant concentrations and thicknesses of the various layers of the device described herein can be varied to produce a device having desired characteristics for a particular application. Similarly, the dimensions of the various features of the device can also be varied to produce a device having desired characteristics for a particular application.

The layers of semiconductor material can be formed by epitaxial growth on a suitable substrate. The layers can be doped during epitaxial growth.

EXPERIMENTAL

Aspects of the present teachings may be further understood in light of the following examples, which should not be construed as limiting the scope of the present teachings in any way.

Figure 3A:
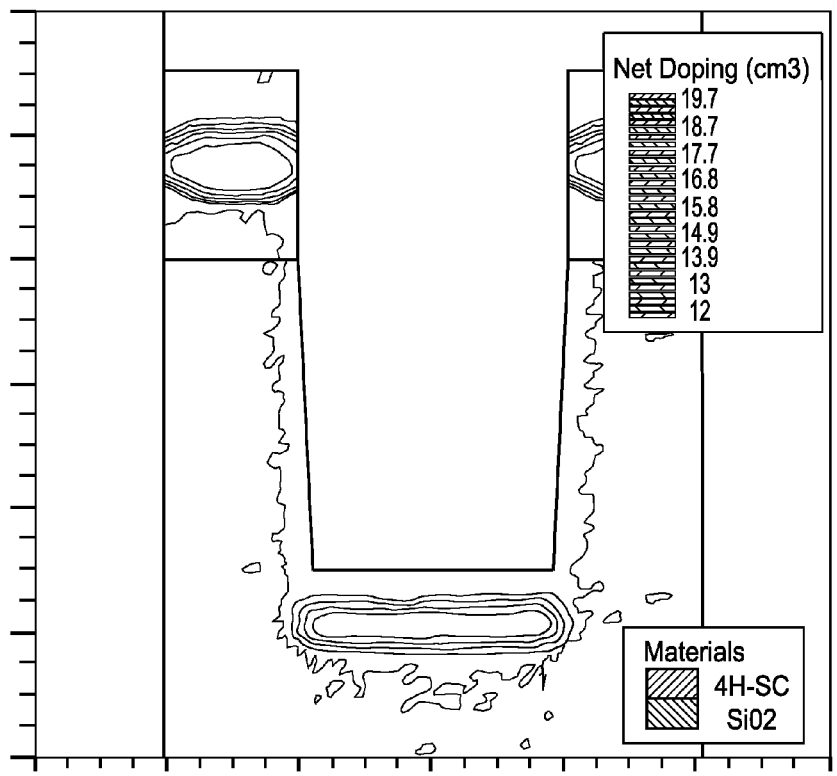
FIG. 3A is simulation showing the dopant profile resulting from near vertical implantation into a trenched structure with sufficient implant mask and finger pitch to allow significant scattering implantation to occur and dope the sidewalls.

Numerical simulations were performed to demonstrate the effect and give an accurate representation of the doping profile due to scattering from the implantation mask. FIG. 3A shows a simulation of the doping profile using near vertical implantation into a trenched SiC structure with sufficient implant mask and finger pitch to allow significant scattering implantation to occur and dope the sidewalls. As shown in FIG. 3A, the sidewall doping creates a long channel that extends from the bottom of the trench to near the top of the semiconductor surface.

Figure 3B:
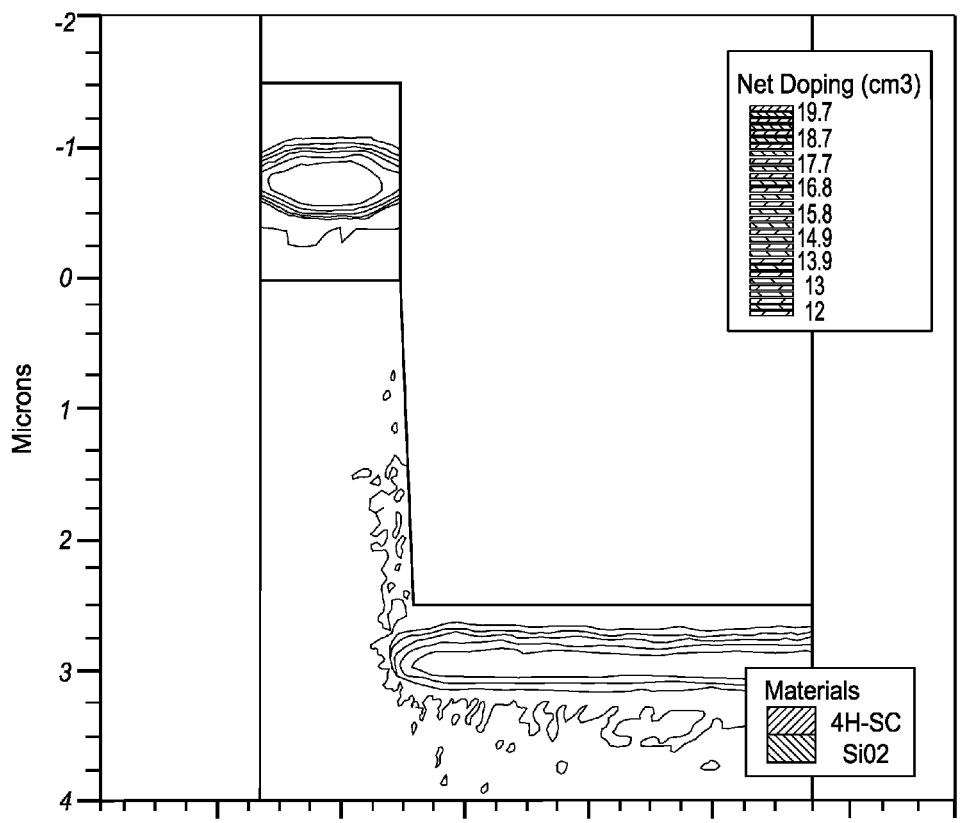
FIG. 3B is simulation conducted under similar conditions as that of FIG. 3A but wherein the device does not have an adjacent source finger to provide ion scattering.

FIG. 3B is the same simulation as FIG. 3A but without the adjacent scattering finger to provide the ion scattering. Notice that there is minimal implantation on the sidewall of the source finger resulting in a short channel.

Figure 4:
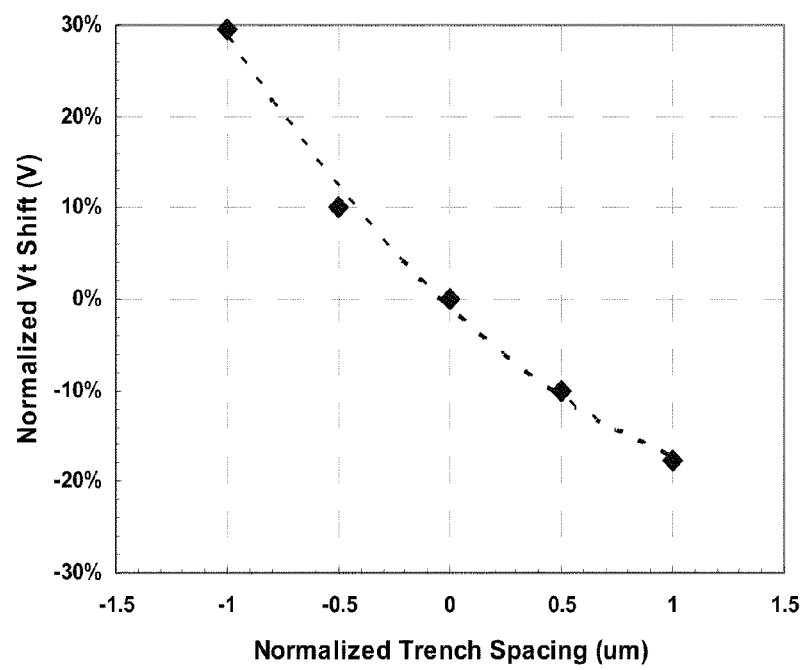
FIG. 4 is a graph showing the effect of scattering on the threshold voltage of a SiC VJFET.

FIG. 4 is a graph showing the effect of scattering on the threshold voltage of a SiC VJFET. As can be seen from FIG. 4, as the trench spacing is increased, the threshold voltage of the device is reduced. While not wishing to be bound by theory, this phenomenon is believed to be due to the reduction of sidewall dose scattered off the adjacent finger profile as the trench spacing is increased. Conversely, the threshold voltage as shown in FIG. 4 increases as the trench spacing is reduced as a result of the increased implant scattering causing a higher level of doping (and longer channel) on all adjacent fingers.

The implant mask thickness can be in the range of 0.5 μm to 5 μm and can be composed of oxide, photoresist, metal layers, or multilayer stacks suitable for implant blocking at the applicable implant energy.

The implant energy used to optimize the scattering effect can range from 60 keV-380 keV for shorter fingers and closely spaced trench structures to 1 MeV for deep and uniform implantation where significant scattering effects are desired.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A method of making a semiconductor device, the method comprising:
   patterning an etch mask above an implant mask layer, wherein the implant mask layer is above a channel layer of a semiconductor material of a first conductivity type and wherein the channel layer is above an upper surface of a semiconductor substrate of the first conductivity type;
   selectively etching through the etch mask to etch portions of the implant mask layer and the channel layer and thereby define raised regions each having an upper surface and sidewalls adjacent to respective of the etched portions, the etched portions each defined by a respective bottom surface;
   implanting ions into the channel layer through the etched portions of the implant mask layer to form implanted regions of a second conductivity type in the semiconductor material beneath the bottom surfaces of the etched portions of the channel layer, wherein the ions are implanted at an angle within +/−10° from perpendicular to the upper surface of the semiconductor substrate and wherein sufficient ions impinging on the implant mask layer during the implanting are scattered by the implant mask to +dope implanted regions of the second conductivity type adjacent the sidewalls of the channel layer in the raised regions,
   wherein the implanted regions beneath the bottom surface of the etched portions are connected to the implanted regions adjacent the sidewalls of the channel layer in the raised regions.

2. The method of claim 1, wherein the channel layer is above a drift layer of the semiconductor material of the first conductivity type which is above the semiconductor substrate.

3. The method of claim 2, wherein the channel and drift layers each have a dopant concentration and wherein the dopant concentration of the channel layer is lower than the dopant concentration of the drift layer.

4. The method of claim 2, wherein the drift layer has a thickness of <200 μm and a dopant concentration of $1\times10^{14}/cm^3$ to $1\times10^{18}/cm^3$.

5. The method of claim 2, wherein, during the implanting of the ions, the implant mask layer is above a source layer of a semiconductor material of the first conductivity type and wherein the source layer is on the channel layer.

6. The method of claim 1, wherein the energy of the ions during implantation is 250 keV to 2 MeV.

7. The method of claim 1, wherein, during the implanting of the ions, the implant mask layer is above a source layer of a semiconductor material of the first conductivity type and the source layer is on the channel layer.

8. The method of claim 7, wherein the source layer has a dopant concentration of $>5\times10^{18}/cm^3$.

9. The method of claim 1, wherein the channel layer and the semiconductor substrate comprise SiC.

10. The method of claim 1, wherein the implant mask layer has a thickness of at least 0.5 μm.

11. The method of claim 1, wherein the channel layer has a thickness of 0.25 to 5 μm and a dopant concentration of $1\times10^{14}/cm^3$ to $1\times10^{18}/cm^3$.

12. The method of claim 1, wherein the implantation mask comprises a photoresist material, an oxide, a nitride or a metal.

13. The method of claim 1, wherein the semiconductor substrate has a dopant concentration of $1\times10^{18}/cm^3$ to $1\times10^{20}/cm^3$.

14. The method of claim 1, further comprising annealing the device to activate the implanted ions and form the +doped implanted regions.

15. The method of claim 1, further comprising:
   forming source contacts on the upper surfaces of the raised regions;
   forming gate contacts on the implanted regions on the bottom surfaces of the etched portions; and
   forming a drain contact on the substrate opposite the channel layer.

16. The method of claim 1, wherein the raised regions comprises a plurality of spaced elongate segments in the form of fingers.

17. The method of claim 1, wherein the ions are implanted into the channel layer at an angle of +/−0.1° from perpendicular to the upper surface of the semiconductor substrate.

18. The method of claim 1, further comprising rotating the substrate during implantation.

19. The method of claim 1, wherein sufficient ions impinging on the implant mask layer during the implanting are scattered by the implant mask to +dope implanted regions to a top of the channel layer.

20. A method of making a semiconductor device, the method comprising:

patterning an etch mask above an implant mask layer, wherein the implant mask layer is above a channel layer of a semiconductor material of a first conductivity type and wherein the channel layer is above an upper surface of a semiconductor substrate of the first conductivity type;

selectively etching through the etch mask to etch portions of the implant mask layer and the channel layer and thereby define raised regions each having an upper surface and sidewalls adjacent to respective of the etched portions, the etched portions each defined by a respective bottom surface;

implanting ions into the channel layer through the etched portions of the implant mask layer to form implanted regions of a second conductivity type in the semiconductor material beneath the bottom surfaces of the etched portions of the channel layer, wherein the ions are implanted at an angle within +/−10° from perpendicular to the upper surface of the semiconductor substrate and wherein sufficient ions impinging on the implant mask layer during the implanting are scattered by the implant mask to dope implanted regions of the second conductivity type adjacent the sidewalls to the top of the channel layer in the raised regions, wherein the implanted regions beneath the bottom surface of the etched portions are connected to the implanted regions adjacent the sidewalls of the channel layer in the raised regions.

* * * * *